(12) United States Patent
Isowaki et al.

(10) Patent No.: US 7,967,993 B2
(45) Date of Patent: Jun. 28, 2011

(54) METHOD OF MANUFACTURING MAGNETIC RECORDING MEDIUM

(75) Inventors: Yousuke Isowaki, Yokohama (JP);
Kaori Kimura, Kawasaki (JP);
Yoshiyuki Kamata, Tokyo (JP);
Masatoshi Sakurai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/508,269

(22) Filed: Jul. 23, 2009

(65) Prior Publication Data
US 2010/0018946 A1   Jan. 28, 2010

(30) Foreign Application Priority Data
Jul. 25, 2008   (JP) ................................ 2008-192537

(51) Int. Cl.
*B44C 1/22* (2006.01)
(52) U.S. Cl. .................. 216/22; 216/44; 216/66; 216/81
(58) Field of Classification Search .................... 216/22, 216/44, 66, 81
See application file for complete search history.

(56) References Cited

U.S. PATENT DOCUMENTS

| | | | |
|---|---|---|---|
| 6,014,296 A | 1/2000 | Ichihara et al. | |
| 6,221,519 B1 | 4/2001 | Doi et al. | |
| 6,266,354 B1 | 7/2001 | Chino et al. | |
| 6,984,529 B2 | 1/2006 | Stojakovic et al. | |
| 7,067,207 B2 | 6/2006 | Kamata et al. | |
| 7,100,263 B2 | 9/2006 | Imada et al. | |
| 2001/0005852 A1 | 12/2001 | Moise et al. | |
| 2002/0090827 A1 | 7/2002 | Yokoshima | |
| 2004/0020894 A1 | 2/2004 | Williams et al. | |
| 2004/0253817 A1 | 12/2004 | Imada et al. | |
| 2005/0000934 A1 | 1/2005 | Nakatani et al. | |
| 2005/0243467 A1 | 11/2005 | Takai et al. | |
| 2005/0284842 A1 | 12/2005 | Okawa et al. | |
| 2006/0003551 A1 | 1/2006 | Mancini et al. | |
| 2006/0021966 A1 | 2/2006 | Hattori et al. | |
| 2006/0124585 A1 | 6/2006 | Suwa et al. | |
| 2006/0183004 A1 | 8/2006 | Hattori et al. | |
| 2006/0222897 A1* | 10/2006 | Kamata et al. ................. 428/826 |
| 2006/0222899 A1* | 10/2006 | Sugimura et al. ............. 428/826 |

(Continued)

FOREIGN PATENT DOCUMENTS

JP   02-207418   8/1990

(Continued)

OTHER PUBLICATIONS

Notice of Reasons for Rejection mailed by Japan Patent Office on Oct. 13, 2009 in the corresponding Japanese Patent Application No. 2008-192537.

(Continued)

*Primary Examiner* — Binh X Tran
(74) *Attorney, Agent, or Firm* — Knobbe Martens Olson & Bear, LLP

(57) ABSTRACT

According to one embodiment, a method of manufacturing a magnetic recording medium includes forming a hard mask and a resist on a magnetic recording layer, imprinting a stamper on the resist to transfer patterns of protrusions and recesses, removing resist residues left in the recesses of the patterned resist, etching the hard mask using the patterned resist as a mask to transfer the patterns of protrusions and recesses, stripping the resist, and performing ion beam etching to remove the remaining hard mask and to modify a surface of the magnetic recording layer uncovered with the remaining hard mask.

1 Claim, 2 Drawing Sheets

U.S. PATENT DOCUMENTS

| | | |
|---|---|---|
| 2007/0059562 A1 | 3/2007 | Hattori et al. |
| 2007/0070547 A1 | 3/2007 | Kamata et al. |
| 2007/0211592 A1 | 9/2007 | Sakurai et al. |
| 2007/0224339 A1 | 9/2007 | Kamata et al. |
| 2007/0263324 A1 | 11/2007 | Allen et al. |
| 2007/0281078 A1 | 12/2007 | Kikitsu et al. |
| 2008/0075845 A1* | 3/2008 | Sonobe et al. ............... 427/130 |
| 2008/0078739 A1 | 4/2008 | Hibi et al. |
| 2008/0093336 A1 | 4/2008 | Lee et al. |
| 2008/0158718 A1 | 7/2008 | Kobayashi et al. |
| 2008/0174914 A1* | 7/2008 | Takai et al. ............... 360/135 |
| 2008/0217615 A1 | 9/2008 | Kerber |
| 2009/0023078 A1 | 1/2009 | Gutmann et al. |
| 2009/0305081 A1* | 12/2009 | Dai et al. ............... 428/833.2 |
| 2009/0308837 A1* | 12/2009 | Albrecht et al. ............... 216/22 |
| 2009/0314740 A1 | 12/2009 | Ikemoto et al. |
| 2010/0018947 A1 | 1/2010 | Kimura et al. |
| 2010/0047625 A1 | 2/2010 | Kamata et al. |
| 2010/0053813 A1 | 3/2010 | Fukushima et al. |
| 2010/0059476 A1* | 3/2010 | Yamamoto et al. ............... 216/22 |
| 2010/0147791 A1 | 6/2010 | Isowaki et al. |
| 2010/0155231 A1 | 6/2010 | Watanabe et al. |
| 2010/0214694 A1 | 8/2010 | Kimura et al. |
| 2010/0214695 A1 | 8/2010 | Isowaki et al. |
| 2010/0215989 A1 | 8/2010 | Isowaki et al. |
| 2011/0000880 A1 | 1/2011 | Kamata et al. |

FOREIGN PATENT DOCUMENTS

| | | |
|---|---|---|
| JP | 03-040219 A | 2/1991 |
| JP | 2005-205257 | 8/1993 |
| JP | 2007-87053 | 9/1995 |
| JP | 11-328652 | 11/1999 |
| JP | 2000-286241 | 10/2000 |
| JP | 2002-501300 | 1/2002 |
| JP | 2002-359138 A | 12/2002 |
| JP | 2003-183859 | 7/2003 |
| JP | 2004-164692 | 6/2004 |
| JP | 2005-042143 | 2/2005 |
| JP | 2005-050468 | 2/2005 |
| JP | 2005-50468 | 2/2005 |
| JP | 2005-056535 | 3/2005 |
| JP | 2005-56535 | 3/2005 |
| JP | 2005-070650 | 3/2005 |
| JP | 2005-071542 | 3/2005 |
| JP | 2005-317155 | 11/2005 |
| JP | 2006-012332 | 1/2006 |
| JP | 2006-147148 | 6/2006 |
| JP | 2006-196143 | 7/2006 |
| JP | 2007-095115 | 4/2007 |
| JP | 2009-170007 | 7/2007 |
| JP | 2008-065944 | 3/2008 |
| JP | 2008-135092 | 6/2008 |
| JP | 2008-135095 | 6/2008 |
| JP | 2008-210450 | 9/2008 |
| JP | 2009-076924 | 4/2009 |
| JP | 2009-181674 | 8/2009 |
| JP | 2009-301655 | 12/2009 |
| JP | 2010-033636 | 2/2010 |
| WO | WO 99/35657 | 7/1999 |
| WO | WO 2008/069082 | 6/2008 |

OTHER PUBLICATIONS

Explanation of Non-English Language Reference(s), 2005.
Translation of the Notice of Reasons for Rejection mailed by JPO on Mar. 9, 2010 for Japanese Patent Application No. 2008-317382 (corresponding to U.S. Appl. No. 12/636,610).
Translation of the Notice of Reasons for Rejection mailed by JPO on Nov. 17, 2009 for Japanese Patent Application No. 2008-213674 (corresponding to U.S. Appl. No. 12/544,606).
Translation of the Notice of Reasons for Rejection mailed by JPO on Oct. 13, 2010 for Japanese Patent Application No. 2008-192536 (corresponding to U.S. Appl. No. 12/509,261).
Translation of the Notice of Reasons for Rejection mailed by JPO on Feb. 2, 2010 for Japanese Patent Application No. 2008-192536 (corresponding to U.S. Appl. No. 12/509,261).
Translation of the Notice of Reasons for Rejection mailed by JPO on Apr. 20, 2010 for Japanese Patent Application No. 2009-038207 (corresponding to U.S. Appl. No. 12/705,456).
Translation of the Notice of Reasons for Rejection mailed by JPO on Apr. 20, 2010 for Japanese Patent Application No. 2009-038206 (corresponding to U.S. Appl. No. 12/705,490).
Translation of the Notice of Reasons for Rejection mailed by JPO on Apr. 20, 2010 for Japanese Patent Application No. 2009-038208 (corresponding to U.S. Appl. No. 12/705,421).

* cited by examiner

METHOD OF MANUFACTURING MAGNETIC RECORDING MEDIUM

CROSS-REFERENCE TO RELATED APPLICATIONS

This application is based upon and claims the benefit of priority from Japanese Patent Application No. 2008-192537, filed Jul. 25, 2008, the entire contents of which are incorporated herein by reference.

BACKGROUND

1. Field

One embodiment of the present invention relates to a method of manufacturing a magnetic recording medium such as a patterned medium.

2. Description of the Related Art

Recently, in magnetic recording media installed in hard disk drives (HDDs), there is an increasing problem of disturbance of enhancement of track density due to interference between adjacent tracks. In particular, a serious technical subject is reduction of a fringe effect of a field from a write head.

To solve such a problem, a discrete track recording-type patterned medium (DTR medium), for example, has been proposed in which recording tracks are physically separated by processing a ferromagnetic layer. The DTR medium can reduce a side erase phenomenon, i.e., erasing information of an adjacent track in writing, and a side read phenomenon, i.e., reading out information of an adjacent track in reading, making it possible to enhance the track density. Therefore, the DTR medium is expected as a magnetic recording medium capable of providing a high recording density. Similarly, a bit patterned medium (BPM) having dot-like magnetic patterns is also expected as a magnetic recording medium capable of providing high recording density.

A known method of manufacturing a patterned medium (DTR medium or BPM) comprises forming a hard mask made of carbon and a resist on the magnetic recording layer, imprinting a stamper to the resist to transfer patterns of protrusions and recesses, etching the hard mask using the resist pattern as a mask to transfer patterns of protrusions and recesses, and etching the magnetic recording layer using the hard mask pattern as a mask to form patterns of protrusions and recesses.

Jpn. Pat. Appln. KOKAI Publication Nos. 2005-50468 and 2005-56535 disclose a step of removing a hard mask entirely by using an ashing apparatus and a reactive etching apparatus. However, if the hard mask is removed entirely by ashing or reactive ion etching, plasma distribution tends to be unstable in the vicinity of the edges of the magnetic recording layer forming protrusions and recesses. Thus, nonuniformity of the plasma distribution causes formation of a damage layer on the surface of the magnetic recording layer when the hard mask is removed. If the damage layer is formed on the surface of the magnetic recording layer in this manner, there is a problem that effective magnetic spacing is so increased that only insufficient read characteristics can be obtained when the medium is installed in a hard disk drive.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, there is provided a method of manufacturing a magnetic recording medium, comprising: forming a hard mask and a resist on a magnetic recording layer; imprinting a stamper on the resist to transfer patterns of protrusions and recesses; removing resist residues left in the recesses of the patterned resist; etching the hard mask using the patterned resist as a mask to transfer the patterns of protrusions and recesses; stripping the resist; and performing ion beam etching to remove the remaining hard mask and to modify a surface of the magnetic recording layer uncovered with the remaining hard mask.

Figure 1:
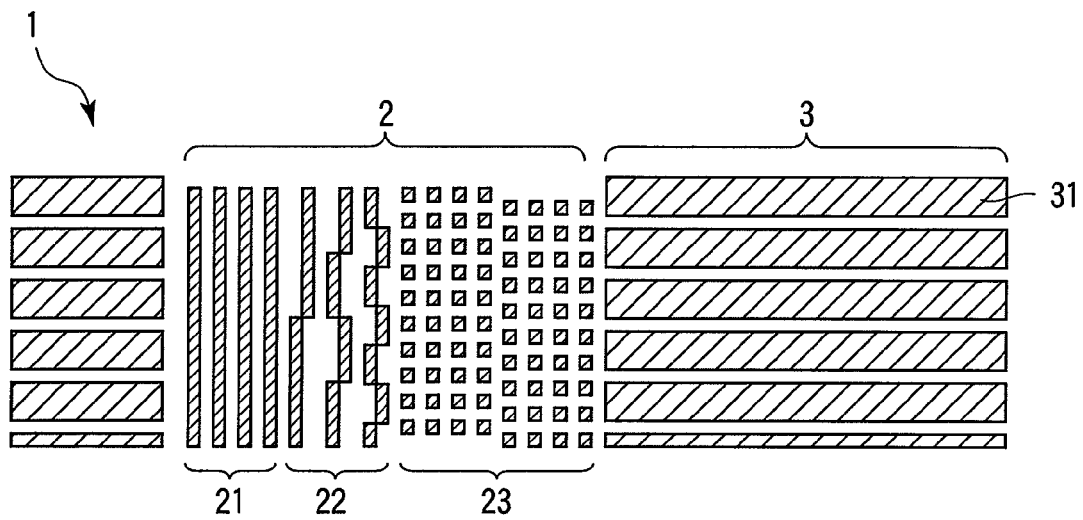
FIG. 1 is a plan view of a DTR medium, which is an example of a patterned medium manufactured by using a method of the present invention, in the circumferential direction.

FIG. 1 is a plan view of a discrete track recording (DTR) medium, which is an example of a patterned medium manufactured by using a method of the present invention, in the circumferential direction. As shown in FIG. 1, servo zones 2 and data zones 3 are alternately formed in the circumferential direction of the patterned medium 1. The servo zone 2 includes a preamble section 21, an address section 22 and a burst section 23. The data zone 3 includes discrete tracks 31 where neighboring tracks are separated from each other.

The patterned medium manufactured by using the method of the present invention is not limited to the DTR medium shown in FIG. 1, but includes a bit patterned medium (BPM) having dot-like magnetic patterns separated not only in a cross-track direction but also in a down-track direction.

An example of a method of manufacturing a magnetic recording medium according to the present invention will be described with reference to FIGS. 2A to 2J.

Figure 2A:
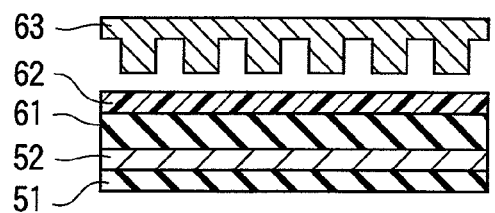
FIGS. 2A to 2J are cross-sectional views showing an example of a method of manufacturing a magnetic recording medium according to the present invention.

As shown in FIG. 2A, an underlayer (not shown) and a 20-nm-thick magnetic recording layer 52 are deposited on a glass substrate 51. A 15-nm-thick hard mask 61 made of carbon is deposited on the magnetic recording layer 52. A resist 62 made of SOG (spin-on glass) is deposited on the hard mask 61 by spin coating. On the other hand, a stamper 63 is prepared on which predetermined patterns of protrusions and recesses corresponding to the patterns of the DTR medium shown in, for example, FIG. 1 are formed. The stamper 63 is produced through steps such as EB lithography and Ni electroforming. The stamper 63 is arranged such that the patterned surface of the stamper 63 faces the resist 62.

Figure 2F:
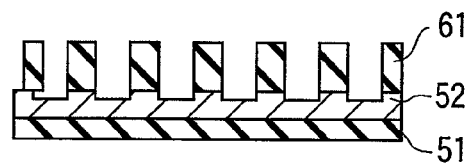
Figure 2B:
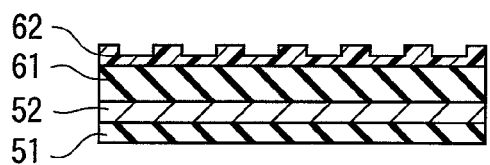

As shown in FIG. 2B, the patterns of protrusions and recesses of the stamper 63 are transferred to the resist 62 by imprinting the stamper 63 to the resist 62. Then, the stamper 63 is removed. Resist residues are left on the bottoms of the recesses of the patterns transferred to the resist 62.

Figure 2G:
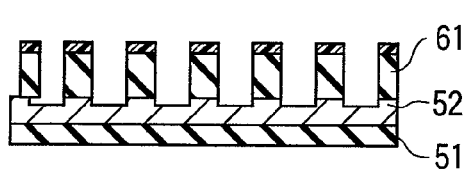
Figure 2C:
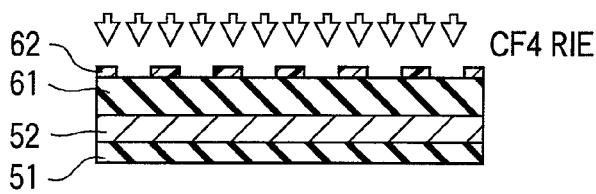

As shown in FIG. 2C, the resist residues in the recesses are removed by dry etching so as to expose the surface of the hard mask 61. At this time, the resist residues are removed with, for example, an induction coupling plasma (ICP) RIE apparatus using $CF_4$ as the etching gas.

Figure 2H:
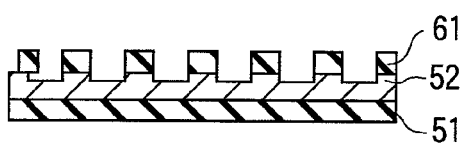
Figure 2D:
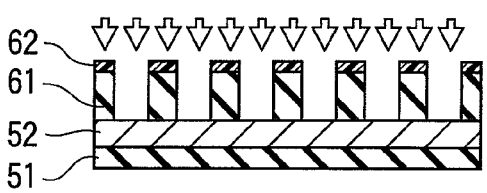

As shown in FIG. 2D, the hard mask 61 is etched using the patterned resist 62 as the mask and oxygen as the etching gas so as to expose the surface of the magnetic recording layer 52.

Figure 2I:
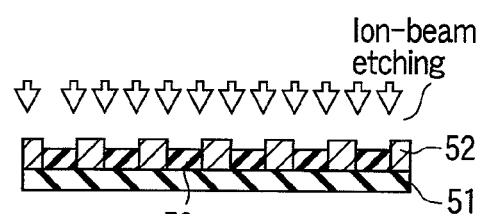
Figure 2E:
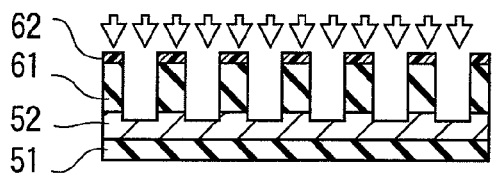

As shown in FIG. 2E, a part of the magnetic recording layer 52 is etched by Ar milling to form a recesses with a depth of 4 nm. As the milling apparatus, an electronic cyclotron resonance (ECR) ion gun, for example, may be used. This step is not always performed, but may be omitted. Also, the etching gas used for the milling is not limited to Ar and a similar gas to that used to remove the remaining hard mask by ion-beam etching according to the present invention may be used.

As shown in FIG. 2F, the resist (SOG) 62 is stripped off with an ICP-RIE apparatus using $CF_4$ as the etching gas.

As shown in FIG. 2G, the magnetic recording layer 52 in the exposed recesses is deactivated so as not to show magnetism. When $CF_4$ is used in the magnetism deactivation step in FIG. 2G, this step may be performed at the same time when the resist is stripped off in FIG. 2F. This step is not always performed, but may also be omitted.

As shown in FIG. 2H, a part of the hard mask 61 is etched with an ICP-RIE apparatus using oxygen as the etching gas. This step is not always performed, but may also be omitted. The thickness of the remaining hard mask 61 is 2 nm, for example.

As shown in FIG. 2I, the remaining hard mask 61 is removed by ion beam etching to expose the surface of the protruded magnetic recording layer 52 and, at the same time, to modify the magnetic recording layer in the recesses to form a nonmagnetic layer 53. The depth of the recesses of the magnetic recording layer is 10 nm, for example.

Figure 2J:
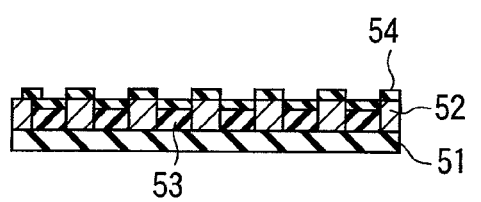

As shown in FIG. 2J, a protective film 54 with a thickness of 3 nm is deposited by CVD (chemical vapor deposition).

In the above steps, the thickness of each film and the depth of the recesses in each film may be easily measured by using, for example, AFM (atomic force microscope) and sectional TEM (transmission electron microscopy). Also, the method shown in FIGS. 2A to 2J may not be limited to the manufacturing of a DTR medium but may also be applied to the manufacturing of a bit patterned medium (BPM).

Here, the ion beam etching step shown in FIG. 2I will be described in more detail.

In the step of FIG. 2I in the method of the present invention, the remaining hard mask 61 is removed by ion beam etching to expose the surface of the protruded magnetic recording layer 52 and, at the same time, to modify the magnetic recording layer in the recesses to form a nonmagnetic layer 53.

Conventionally, the step of removing the remaining hard mask is carried out with an ashing apparatus or a reactive etching apparatus. However, when the ashing apparatus or reactive ion etching apparatus is used, the plasma distribution tends to be unstable in the vicinity of the edges of the magnetic recording layer 52. Thus, a damage layer is formed on the surface of the protruded magnetic recording layer 52 which is exposed when the hard mask is removed. If a medium having a magnetic recording layer 52 on which such a damage layer is formed is installed in a hard disk drive, there is a problem that effective magnetic spacing is so increased that only insufficient read characteristics can be obtained.

In the method of the present invention, on the other hand, the hard mask is removed by highly directive ion beam etching and therefore, the hard mask can be removed uniformly, making it possible to prevent the formation of a damage layer on the surface of the protruded magnetic recording layer. Accordingly, when the resulting medium is installed in a hard disk drive, the effective magnetic spacing between the head and the medium is so decreased that sufficient read characteristics can be obtained. Also, in the case where the damage layer exists on the surface of the magnetic recording layer in the recesses, a nonmagnetic layer 53 can be formed in such a condition that the damage layer of this part is modified. Therefore, the adhesion of the nonmagnetic layer 53 to the protective film to be formed on the nonmagnetic layer 53 is improved, making possible to suppress the occurrence of corrosion.

He, Ar, Ne, Kr, Xe, $N_2$ or a mixed gas thereof is preferably used for the ion beam etching. If these gases are used, a damage layer is scarcely formed on the magnetic recording layer and it is therefore possible to reduce the magnetic spacing while suppressing the formation of a damage layer. If gas such as $CF_4$ or $O_2$ is used on the other hand, fluorides or oxides are produced in the magnetic recording layer, so that a damage layer is easily formed in the magnetic recording layer, leading to an undesirable increase in magnetic spacing.

The thickness of the hard mask left before it is removed by ion beam etching is preferably 5 nm or less. When the thickness of the remaining hard mask is larger than 5 nm, it is preferable to reduce the thickness of the hard mask by reactive ion etching and then to remove the remaining hard mask by ion beam etching. Therefore, if such a method is used, the magnetic spacing can be reduced while suppressing the formation of the damage layer and also, the etching depth in the recesses of the magnetic recording layer can be limited, leading to an improved process tact.

The depth of the recesses of the magnetic recording layer 52 after the hard mask is removed is preferably 15 nm or less. If the depth of the recesses of the magnetic recording layer 52 is 15 nm or less, the head flying characteristics can be stabilized when the medium is installed in a hard disk without carrying out an additional step of filling the nonmagnetic body in the recesses.

When the remaining hard mask is removed by ion beam etching, the magnetic recording layer in the recesses is etched at the same time. Thus, in order to decrease the depth of the recesses of the magnetic recording layer 52 to 15 nm or less, the etching depth when a part of the magnetic recording layer is etched in the step of FIG. 2E which is performed if desired, and the thickness of the hard mask left before the step of removing the hard mask in the step of FIG. 2H are preferably controlled appropriately. In particular, the thickness of the remaining hard mask before the step of removing the hard mask is preferably 5 nm or less from the viewpoint of selective ratio for ion beam etching in the step of FIG. 2I as described above.

Next, preferable materials to be used in the embodiments of the present invention will be described.

<Substrate>

As the substrate, for example, a glass substrate, Al-based alloy substrate, ceramic substrate, carbon substrate or Si single crystal substrate having an oxide surface may be used. As the glass substrate, amorphous glass or crystallized glass is used. Examples of the amorphous glass include common soda lime glass and aluminosilicate glass. Examples of the crystallized glass include lithium-based crystallized glass. Examples of the ceramic substrate include common aluminum oxide, aluminum nitride or a sintered body containing silicon nitride as a major component and fiber-reinforced materials of these materials. As the substrate, those having a NiP layer on the above metal substrates or nonmetal substrates formed by plating or sputtering may be used.

<Soft Magnetic Underlayer>

The soft magnetic underlayer (SUL) serves a part of such a function of a magnetic head as to pass a recording magnetic field from a single-pole head for magnetizing a perpendicular magnetic recording layer in a horizontal direction and to circulate the magnetic field to the side of the magnetic head, and applies a sharp and sufficient perpendicular magnetic field to the recording layer, thereby improving read/write efficiency. For the soft magnetic underlayer, a material containing Fe, Ni or Co may be used. Examples of such a material may include FeCo-based alloys such as FeCo and FeCoV, FeNi-based alloys such as FeNi, FeNiMo, FeNiCr and FeNiSi, FeAl-based alloys and FeSi-based alloys such as FeAl, FeAlSi, FeAlSiCr, FeAlSiTiRu and FeAlO, FeTa-based alloys such as FeTa, FeTaC and FeTaN and FeZr-based alloys such as FeZrN. Materials having a microcrystalline structure such as FeAlO, FeMgO, FeTaN and FeZrN containing Fe in an amount of 60 at % or more or a granular structure in which fine crystal grains are dispersed in a matrix may also be used. As other materials to be used for the soft magnetic underlayer, Co alloys containing Co and at least one of Zr, Hf, Nb, Ta, Ti and Y may also be used. Such a Co alloy preferably contains 80 at % or more of Co. In the case of such a Co alloy, an amorphous layer is easily formed when it is deposited by sputtering. Because the amorphous soft magnetic material is not provided with crystalline anisotropy, crystal defects and grain boundaries, it exhibits excellent soft magnetism and is capable of reducing medium noise. Preferable examples of the amorphous soft magnetic material may include CoZr-, CoZrNb- and CoZrTa-based alloys.

An underlayer may further be formed beneath the soft magnetic underlayer to improve the crystallinity of the soft magnetic underlayer or to improve the adhesion of the soft magnetic underlayer to the substrate. As the material of such an underlayer, Ti, Ta, W, Cr, Pt, alloys containing these metals or oxides or nitrides of these metals may be used. An intermediate layer made of a nonmagnetic material may be formed between the soft magnetic underlayer and the recording layer. The intermediate layer has two functions including the function to cut the exchange coupling interaction between the soft magnetic underlayer and the recording layer and the function to control the crystallinity of the recording layer. As the material for the intermediate layer Ru, Pt, Pd, W, Ti, Ta, Cr, Si, alloys containing these metals or oxides or nitrides of these metals may be used.

In order to prevent spike noise, the soft magnetic underlayer may be divided into plural layers and Ru layers with a thickness of 0.5 to 1.5 nm are interposed therebetween to attain anti-ferromagnetic coupling. Also, a soft magnetic layer may be exchange-coupled with a pinning layer of a hard magnetic film such as CoCrPt, SmCo or FePt having longitudinal anisotropy or an anti-ferromagnetic film such as IrMn and PtMn. A magnetic film (such as Co) and a nonmagnetic film (such as Pt) may be provided under and on the Ru layer to control exchange coupling force.

<Magnetic Recording Layer>

For the perpendicular magnetic recording layer, a material containing Co as a main component, at least Pt and further an oxide is preferably used. The perpendicular magnetic recording layer may contain Cr if needed. As the oxide, silicon oxide or titanium oxide is particularly preferable. The perpendicular magnetic recording layer preferably has a structure in which magnetic grains, i.e., crystal grains having magnetism, are dispersed in the layer. The magnetic grains preferably have a columnar structure which penetrates the perpendicular magnetic recording layer in the thickness direction. The formation of such a structure improves the orientation and crystallinity of the magnetic grains of the perpendicular magnetic recording layer, with the result that a signal-to-noise ratio (SN ratio) suitable to high-density recording can be provided. The amount of the oxide to be contained is important to provide such a structure.

The content of the oxide in the perpendicular magnetic recording layer is preferably 3 mol % or more and 12 mol % or less and more preferably 5 mol % or more and 10 mol % or less based on the total amount of Co, Cr and Pt. The reason why the content of the oxide in the perpendicular magnetic recording layer is preferably in the above range is that, when the perpendicular magnetic recording layer is formed, the oxide precipitates around the magnetic grains, and can separate fine magnetic grains. If the oxide content exceeds the above range, the oxide remains in the magnetic grains and damages the orientation and crystallinity of the magnetic grains. Moreover, the oxide precipitates on the upper and lower parts of the magnetic grains, with an undesirable result that the columnar structure, in which the magnetic grains penetrate the perpendicular magnetic recording layer in the thickness direction, is not formed. The oxide content less than the above range is undesirable because the fine magnetic grains are insufficiently separated, resulting in increased noise when information is reproduced, and therefore, a signal-to-noise ratio (SN ratio) suitable to high-density recording is not provided.

The content of Cr in the perpendicular magnetic recording layer is preferably 0 at % or more and 16 at % or less and more preferably 10 at % or more and 14 at % or less. The reason why the content of the Cr is preferably in the above range is that the uniaxial crystal magnetic anisotropic constant Ku of the magnetic grains is not too much reduced and high magnetization is retained, with the result that read/write characteristics suitable to high-density recording and sufficient thermal fluctuation characteristics are provided. The Cr content exceeding the above range is undesirable because Ku of the magnetic grains is lowered, and therefore, the thermal fluctuation characteristics are deteriorated, and also, the crystallinity and orientation of the magnetic grains are impaired, resulting in deterioration in read/write characteristics.

The content of Pt in the perpendicular magnetic recording layer is preferably 10 at % or more and 25 at % or less. The reason why the content of Pt is preferably in the above range is that the Ku value required for the perpendicular magnetic layer is provided, and further, the crystallinity and orientation of the magnetic grains are improved, with the result that the thermal fluctuation characteristics and read/write characteristics suitable to high-density recording are provided. The Pt content exceeding the above range is undesirable because a layer having an fcc structure is formed in the magnetic grains and there is a risk that the crystallinity and orientation are impaired. The Pt content less than the above range is undesirable because a Ku value satisfactory for the thermal fluctuation characteristics suitable to high-density recording is not provided.

The perpendicular magnetic recording layer may contain one or more types of elements selected from B, Ta, Mo, Cu, Nd, W, Nb, Sm, Tb, Ru and Re besides Co, Cr, Pt and the oxides. When the above elements are contained, formation of fine magnetic grains is promoted or the crystallinity and orientation can be improved and read/write characteristics and thermal fluctuation characteristics suitable to high-density recording can be provided. The total content of the above elements is preferably 8 at % or less. The content exceeding 8 at % is undesirable because phases other than the hcp phase are formed in the magnetic grains and the crystallinity and orientation of the magnetic grains are disturbed, with the result that read/write characteristics and thermal fluctuation characteristics suitable to high-density recording are not provided.

As the perpendicular magnetic recording layer, a CoPt-based alloy, CoCr-based alloy, CoPtCr-based alloy, CoPtO, CoPtCrO, CoPtSi, CoPtCrSi, a multilayer structure of an alloy layer containing at least one type selected from the group consisting of Pt, Pd, Rh and Ru and a Co layer, and materials obtained by adding Cr, B or O to these layers, for example, CoCr/PtCr, CoB/PdB and CoO/RhO may be used.

The thickness of the perpendicular magnetic recording layer is preferably 5 to 60 nm and more preferably 10 to 40 nm. When the thickness is in this range, a magnetic recording apparatus suitable to higher recording density can be manufactured. If the thickness of the perpendicular magnetic recording layer is less than 5 nm, read outputs are too low and noise components tend to be higher. If the thickness of the perpendicular magnetic recording layer exceeds 40 nm, read outputs are too high and the waveform tends to be distorted. The coercivity of the perpendicular magnetic recording layer is preferably 237000 A/m (3000 Oe) or more. If the coercivity is less than 237000 A/m (3000 Oe), thermal fluctuation resistance tends to be deteriorated. The perpendicular squareness of the perpendicular magnetic recording layer is preferably 0.8 or more. If the perpendicular squareness is less than 0.8, the thermal fluctuation resistance tends to be deteriorated.

<Protective Layer>

The protective layer is provided for the purpose of preventing corrosion of the perpendicular magnetic recording layer and also preventing the surface of a medium from being damaged when the magnetic head is brought into contact with the medium. Examples of the material of the protective layer include those containing C, $SiO_2$ or $ZrO_2$. The thickness of the protective layer is preferably 1 to 10 nm. This is preferable for high-density recording because the distance between the head and the medium can be reduced. Carbon may be classified into $sp^2$-bonded carbon (graphite) and $sp^3$-bonded carbon (diamond). Though $sp^3$-bonded carbon is superior in durability and corrosion resistance to graphite, it is inferior in surface smoothness to graphite because it is crystalline material. Usually, carbon is deposited by sputtering using a graphite target. In this method, amorphous carbon in which $sp^2$-bonded carbon and $sp^3$-bonded carbon are mixed is formed. Carbon in which the ratio of $sp^3$-bonded carbon is larger is called diamond-like carbon (DLC). DLC is superior in durability and corrosion resistance and also in surface smoothness because it is amorphous and therefore utilized as the surface protective layer for magnetic recording media. The deposition of DLC by CVD (chemical vapor deposition) produces DLC through excitation and decomposition of raw gas in plasma and chemical reactions, and therefore, DLC richer in $sp^3$-bonded carbon can be formed by adjusting the conditions.

Next, preferred manufacturing conditions in each process in the embodiments of the present invention will be described.

<Imprinting>

A resist is applied to the surface of a substrate by spin-coating and then, a stamper is pressed against the resist to thereby transfer the patterns of the stamper to the resist. As the resist, for example, spin-on-glass (SOG) may be used. The surface of the stamper on which patterns of protrusions and recesses corresponding to servo information and recording tracks are formed is made to face the resist on the substrate. In this process, the stamper, the substrate and a buffer layer are placed on the lower plate of a die set and are sandwiched between the lower plate and the upper plate of the die set to be pressed under a pressure of 2000 bar for 60 seconds, for example. The height of the protrusions of the patterns formed on the resist by imprinting is, for instance, 60 to 70 nm. The above conditions are kept for about 60 seconds for transporting the resist to be excluded. In this case, if a fluorine-containing peeling agent is applied to the stamper, the stamper can be peeled from the resist satisfactorily. The material for the resist should be etching resistant against oxygen and not limited to spin-on-glass (SOG). The material for the resist includes, for example, polysiloxane, polysilane, and alkoxide of Ti and Al.

<Removal of Resist Residues>

Resist residues left unremoved on the bottoms of the recesses of the resist are removed by RIE (reactive ion etching). In this process, an appropriate process gas corresponding to the material of the resist is used. The appropriate process gas for SOG is $CF_4$ or $SF_6$, for example. As the plasma source, ICP (inductively coupled plasma) apparatus capable of producing high-density plasma under a low pressure is preferable, but an ECR (electron cyclotron resonance) plasma or general parallel-plate RIE apparatus may be used.

<Etching of Magnetic Recording Layer>

The magnetic recording layer is processed using etching masks of the resist pattern, from which the resist residues produced in the imprinting are removed, and the pattern of the carbon-based hard mask, which is formed using the resist pattern as a mask. If the magnetic recording layer is processed by Ar ion milling, for example, the acceleration voltage is set to 400V and incident angle of ions is varied between 30° and 70°. In milling using an ECR ion gun, if etching is carried out under static opposition arrangement (incident angle of ions is 90°), a taper is scarcely formed on the side walls of the protruded magnetic patterns.

The milling depth is appropriately adjusted depending on head flying characteristics. That is, the depth of the recesses in the magnetic recording layer, in the state of the finally manufactured medium after the all processes including exposing the protruded magnetic recording layer by ion beam etching and surface modification of the magnetic recording layer in the recesses are carried out, is adjusted such a range that the head flying characteristics are made stable. Specifically, the depth of the recessed in the magnetic recording layer is preferably 15 nm or less.

<Deposition of Protective Layer and Aftertreatment>

A carbon protective layer is deposited. The carbon protective layer may be deposited by CVD, sputtering or vacuum evaporation. CVD produces a DLC film containing a large amount of $sp^3$-bonded carbon. The carbon protective layer with a thickness less than 1 nm is not preferable because it results in unsatisfactory coverage. Whereas, a carbon protective layer with a thickness exceeding 10 nm is not preferable because it increases magnetic spacing between a read/write head and a medium, leading to a reduction in SNR. A lubricant is applied to the surface of the protective layer. As the lubricant, for example, perfluoropolyether, fluorinated alcohol, fluorinated carboxylic acid or the like is used.

Figure 3:
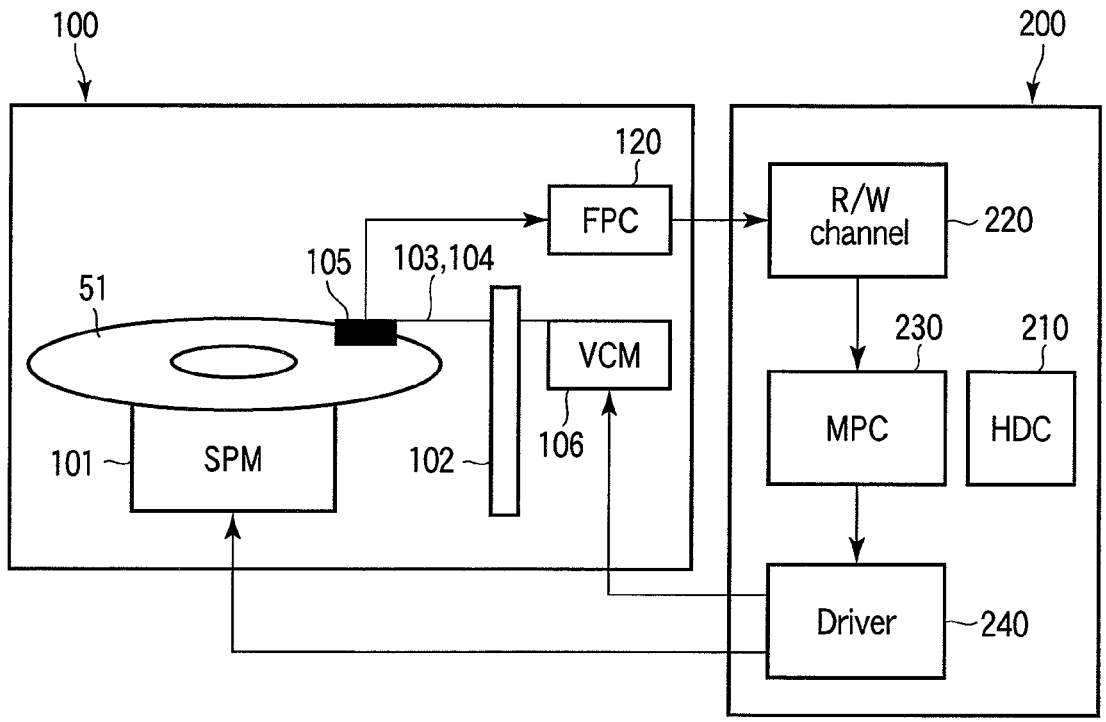
FIG. 3 is a block diagram of a magnetic recording apparatus according to the present invention.

Now, a magnetic recording apparatus having the magnetic recording medium according to the present invention will be described. FIG. 3 shows a block diagram of the magnetic recording apparatus according to an embodiment of the present invention. The figure shows a head slider only over a top side of the magnetic recording medium. However, a perpendicular magnetic recording layer having discrete tracks is formed on both sides of the magnetic recording medium. A down head and an up head are provided over the top side and under the bottom side of the magnetic recording medium, respectively. The configuration of the magnetic recording apparatus according to the present invention is basically similar to that of the conventional magnetic recording apparatus except that the former uses the magnetic recording medium according to the present invention.

A disk drive includes a main body portion called a head disk assembly (HDA) 100 and a printed circuit board (PCB) 200.

The head disk assembly (HDA) 100 has a magnetic recording medium (DTR medium) 51, a spindle motor 101 that rotates the magnetic recording medium 51, an actuator arm 103 that moves around a pivot 102, a suspension 104 attached to a tip of the actuator arm 103, a head slider 105 supported by the suspension 104 and including a read head and a write head, a voice coil motor (VCM) 106 that drives the actuator arm 103, and a head amplifier (not shown) that amplifies input signals to and output signals from the head. The head amplifier (HIC) is provided on the actuator arm 103 and connected to the printed circuit board (PCB) 200 via a flexible cable (FPC) 120. Providing the head amplifier (HIC) on the actuator arm 103 as described above enables an effective reduction in noise in head signals. However, the head amplifier (HIC) may be fixed to the HDA main body.

The perpendicular magnetic recording layer is formed on both sides of the magnetic recording medium 51 as described above. On each of the opposite perpendicular magnetic recording layers, the servo zones are formed like circular arcs so as to coincide with the locus along which the head moves. Specifications for the magnetic recording medium satisfy an outer diameter, an inner diameter, and read/write properties which are adapted for the drive. The radius of the circular arc formed by the servo zone is given as the distance from the pivot to the magnetic head element.

Four main system LSIs are mounted on the printed circuit board (PCB) 200. The four main system LSIs include a disk controller (HDC) 210, a read/write channel IC 220, a MPU 230, and a motor driver IC 240.

The MPU 230 is a control section for a driving system and includes ROM, RAM, CPU, and a logic processing section which are required to implement a head positioning control system according to the present embodiment. The logic processing section is an arithmetic processing section composed of a hardware circuit to execute high-speed arithmetic processes. The firmware (FW) for the logic processing section is stored in ROM. MPU controls the drive in accordance with FW.

The disk controller (HDC) 210 is an interface section in the hard disk and exchanges information with an interface between the disk drive and a host system (for example, a personal computer), MPU, the read/write channel IC, and the motor driver IC to control the entire drive.

The read/write channel IC 220 is a head signal processing section composed of a circuit which switches a channel to the head amplifier (HIC) and which processes read/write signals.

The motor driver IC 240 is a driver section for the voice coil motor (VCM) 77 and the spindle motor 72. The motor driver IC 240 controls the spindle motor 72 to a given rotation speed and provides a VCM manipulation variable from MPU 230 to VCM 77 as a current value to drive a head moving mechanism.

EXAMPLES

Examples of the present invention will be described.

Example 1

Using a Ni stamper having patterns of protrusions and recesses corresponding to a DTR medium shown in FIG. 1, a DTR medium was manufactured by the method shown in FIGS. 2A to 2J. The conditions in each step are as follows.

The step of removing resist residues shown in FIG. 2C was carried out with an ICP-RIE apparatus using $CF_4$ in the following conditions: gas pressure: 0.1 Pa, antenna power: 100 W, bias power: 20 W and etching time: 38 seconds.

The step of etching the hard mask to expose the surface of the magnetic recording layer 52 shown in FIG. 2D was carried out with an ICP-RIE apparatus using $O_2$ in the following conditions: gas pressure: 0.1 Pa, antenna power: 100 W, bias power: 20 W and etching time: 20 seconds.

The step of etching a part of the magnetic recording layer 52 by Ar milling shown in FIG. 2E was carried out in the following conditions: gas pressure: 0.04 Pa, plasma power: 500 W, acceleration voltage: 600 V and etching time: 13 seconds.

The step of stripping the resist shown in FIG. 2F and the step of deactivating the magnetism of the magnetic recording layer 52 in the recesses shown in FIG. 2G were carried out with an ICP-RIE apparatus using $CF_4$ in the following conditions: gas pressure: 1.5 Pa, antenna power: 600 W, bias power: 0 W and etching time: 30 seconds.

The step of etching the hard mask 61 shown in FIG. 2H was carried out with an ICP-RIE apparatus using $O_2$ in the following conditions: gas pressure: 0.8 Pa, antenna power: 400 W, bias power: 0 W and etching time: 13 seconds. The thickness of the remaining hard mask after this step was examined by TEM observation, and found to be 2 nm.

The step of removing the remaining hard mask 61 by ion beam etching shown in FIG. 2I to expose the surface of the protruded magnetic recording layer 52 and, at the same time, to modify the magnetic recording layer in the recesses was carried out using Ar. The depth of the protrusions of the magnetic recording layer 52 after this step was examined by TEM observation, and found to be 10 nm.

A lubricant was applied to the manufactured DTR medium, which was then installed in a drive to evaluate the bit error rate and a value as low as $10^{-6}$ was obtained. For a corrosion test, the amount of Co eluted from the medium was measured by ICP-MS (inductively coupled plasma-mass spectrometry) and was found to be as very small as 0.03 [µg] per unit area.

Comparative Example 1

In steps corresponding to FIGS. 2H and 2I, all the remaining hard mask was removed by an ICP-RIE apparatus using oxygen. The depth of the magnetic recording layer in the recesses after the processing was finished was confirmed to be 10 nm by AFM. A DTR medium was manufactured in the same procedures as in Example 1 except for the above.

The depth of the recesses in the magnetic recording layer of the medium obtained in Example 1 was 10 nm that was equal to that obtained in Comparative Example 1. However, in the case of the medium of Comparative Example 1, the step of exposing the protruded magnetic recording layer and, at the same time, modifying the surface of the magnetic recording layer in the recesses by ion beam etching was not carried out unlike the case of the medium of Example 1.

A lubricant was applied to the manufactured DTR medium, which was then installed in a drive to evaluate the bit error rate and a value as high as $10^{-4}$ was obtained and therefore, the DTR medium was unsuitable to a magnetic recording medium. Many scratches caused by sliding contact with the head were observed on the surface of the medium. The scratched area was analyzed by SEM-EDX, to find that the protective film was peeled off. Also, when the medium was observed with a sectional TEM, to find that the contrast of the surface of the protruded magnetic recording layer was changed and therefore, which showed that the surface was oxidized. The reason why a good bit error rate was not obtained is considered to be that the effective magnetic spacing is increased by oxidation. Moreover, when the amount of eluted Co was measured for a corrosion test in the same manner as in Example 1, it was 100 [μg] per unit area and was increased more significantly than that in Example 1.

It is found from comparison with the method of Comparative Example 1 that, in the method of Example 1, the protruded magnetic recording layer is exposed by ion beam etching to modify the surface of the magnetic recording layer in the recesses and therefore the formation of a damage layer in the magnetic recording layer can be limited, making it possible to reduce magnetic spacing and to manufacture a patterned medium superior in adhesion to the protective layer.

Example 2

In FIG. 2H, the etching time with the ICP-RIE apparatus using oxygen was regulated to change the thickness of the remaining hard mask. The thicknesses of the remaining hard masks after this step were observed with a sectional TEM and were found to be 2 nm, 5 nm and 7 nm.

When the thickness of the remaining hard mask was set to 5 nm or 7 nm, the step of etching a part of the magnetic recording layer 52 by Ar milling shown in FIG. 2E was omitted.

A DTR medium was produced by the same method as in Example 1 except for these steps.

After the step of FIG. 2I, the depth of the recesses in the magnetic recording layer was measured with AFM. As a result, the depths of the recesses in the magnetic recording layers were 10 nm, 15 nm and 19 nm in the cases where the thicknesses of the remaining hard masks were 2 nm, 5 nm and 7 nm, respectively.

A lubricant was applied to the manufactured DTR medium, which was then installed in a drive to evaluate the bit error rate. In the case of the medium in which the depth of the recesses in the magnetic recording layer was 10 nm or 15 nm, the head flying characteristics were stable and therefore, a good bit error rate as low as $10^{-6}$ was obtained. In the case of the medium in which the depth of the recesses in the magnetic recording layer was 19 nm, the head flying was not stabilized and the head was brought into contact with the surface of the medium, so that the evaluation could not be achieved. The reason is considered to be that the head flying could not be stabilized because the recesses of the magnetic recording layer was too deep.

With regard to the medium in which the depth of the recesses in the magnetic recording layer was 10 nm or 15 nm, the amount of eluted Co for a corrosion test was measured, to find that it was as very small as 0.03 [μg] per unit area.

It is understood from the above results that if the thickness of the remaining hard mask before the hard mask is removed by ion beam etching is 5 nm or less or if the depth of the recesses in the magnetic recording layer after the ion beam etching is finished is 15 nm or less, a patterned medium can be manufactured which shows stable head flying characteristics and reduced magnetic spacing and is superior in adhesion to the protective film.

Example 3

Four types of DTR mediums were manufactured in the same manner as in Example 1 except that the etching time for the magnetic recording layer by using Ar milling in FIG. 2E was regulated to change the depth of the recesses in the magnetic recording layer. The depths of the recesses in the magnetic recording layers after the medium was processed were measured with AFM, and as a result, they were 6 nm, 10 nm, 15 nm and 20 nm, respectively.

A lubricant was applied to the manufactured DTR medium, which was then installed in a drive to evaluate the bit error rate. In the case of the medium in which the depth of the recesses in the magnetic recording layer was 6 nm, 10 nm or 15 nm, the head flying was stable and therefore, a good bit error rate as low as about $10^{-6}$ was obtained. In the case of the medium in which the depth of the recesses of the magnetic recording layer was 20 nm, the head flying was not stable and the head was brought into contact with the surface of the medium, so that the evaluation could not be achieved. The reason is considered to be that the head flying could not be stabilized because the depth of the recesses in the magnetic recording layer was too deep.

With regard to the medium in which the depth of the recesses of the magnetic recording layer was 6 nm, 10 nm or 15 nm, the amount of eluted Co for a corrosion test was measured, to find that it was as very small as 0.03 [μg].

It is understood from the above results that if the depth of the recesses in the magnetic recording layer after the step of exposing the protruded magnetic recording layer while modifying the surface of the magnetic recording layer in the recesses by ion beam etching is 15 nm or less, a patterned medium can be manufactured which shows stable head flying characteristics and reduced magnetic spacing and is superior in adhesion to the protective film.

Example 4

DTR mediums were manufactured in the same manner as in Example 1 by using He, Ne, Ar, Kr, Xe, $N_2$, He—$N_2$ or $CF_4$ as the ion beam etching gas to be used for removing the remaining hard mask in the step of FIG. 2I.

A lubricant was applied to the manufactured DTR medium, which was then installed in a drive to evaluate the bit error rate. When ion beam etching gas except for $CF_4$ was used as the ion beam etching gas, a good bit error rate as low as $10^{-6}$ or less was obtained. When $CF_4$ was used as the ion beam etching gas, a poor bit error rate as high as $10^{-4}$ or more was obtained, showing that the DTR medium was unsuitable as a magnetic recording medium. When the medium was observed with a sectional TEM, the contrast of the surface of the protruded magnetic recording layer was changed, to find that the surface was corroded by $CF_4$. The reason why a good bit error rate was not obtained is considered to be that effective magnetic spacing was increased by corrosion.

Also, the amount of eluted Co for a corrosion test was measured. When ion beam etching gas except for $CF_4$ was used, the amount of eluted Co was found to be as very small as about 0.03 [μg] per unit area. When $CF_4$ was used as the ion beam etching gas, on the other hand, the amount of eluted Co was found to be as very large as about 100 [μg] per unit area.

These results are shown in Table 1.

It is understood from the above results that a patterned medium can be manufactured which can reduce the magnetic spacing while suppressing the formation of a damage layer on the surface of the magnetic recording layer and is superior in adhesion to the protective film by using He, Ne, Ar, Kr, Xe, $N_2$ or mixed gas thereof as the ion beam etching gas.

TABLE 1

| Ion beam etching gas | BER [$10^{-x}$] | Amount of eluted Co [μg/m$^2$] |
|---|---|---|
| He | 6 | 0.03 |
| Ne | 6.2 | 0.04 |

TABLE 1-continued

| Ion beam etching gas | BER $[10^{-x}]$ | Amount of eluted Co $[\mu g/m^2]$ |
|---|---|---|
| Ar | 6.7 | 0.02 |
| Kr | 6.3 | 0.04 |
| Xe | 6.3 | 0.04 |
| $N_2$ | 6.1 | 0.05 |
| He—$N_2$ | 6.9 | 0.03 |
| $CF_4$ | 4.1 | 100 |

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a magnetic recording medium, comprising:

forming a hard mask comprising carbon and a resist on a magnetic recording layer;

imprinting a stamper on the resist in order to transfer patterns of protrusions and recesses;

removing resist residues left in the recesses of the patterned resist;

etching the hard mask using the patterned resist as a mask in order to transfer the patterns of protrusions and recesses;

stripping the resist;

reducing a thickness of the remaining hard mask to 5 nm or less by reactive ion etching with oxygen or a mixed gas comprising oxygen; and removing the remaining hard mask and modifying a surface of the magnetic recording layer uncovered with the remaining hard mask by ion beam etching with a gas selected from the group consisting of Helium(He), Neon (Ne), Argon(Ar), Krypton(Kr), Xenon(Xe), Nitrogen ($N_2$) and a mixture thereof, wherein a depth of the recesses of the magnetic recording layer is 15 nm or less after the remaining hard mask is removed.

* * * * *